United States Patent
Böhmer et al.

(10) Patent No.: US 10,680,602 B2
(45) Date of Patent: Jun. 9, 2020

(54) CONTROL DEVICE FOR DRIVING A BIPOLAR SWITCHABLE POWER SEMICONDUCTOR COMPONENT, SEMICONDUCTOR MODULE AND METHOD

(71) Applicant: Siemens Aktiengesellschaft, München (DE)

(72) Inventors: Jürgen Böhmer, Stein (DE); Rüdiger Kleffel, Erlangen (DE); Eberhard Ulrich Krafft, Nürnberg (DE); Andreas Nagel, Nürnberg (DE); Jan Weigel, Grossenbuch (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 0 days.

(21) Appl. No.: 16/478,396

(22) PCT Filed: Nov. 7, 2017

(86) PCT No.: PCT/EP2017/078420
§ 371 (c)(1),
(2) Date: Jul. 16, 2019

(87) PCT Pub. No.: WO2018/133962
PCT Pub. Date: Jul. 26, 2018

(65) Prior Publication Data
US 2019/0379373 A1    Dec. 12, 2019

(30) Foreign Application Priority Data
Jan. 18, 2017  (EP) .................... 17151987

(51) Int. Cl.
*H03K 17/16*   (2006.01)
*H03K 17/0412* (2006.01)
*H03K 17/0414* (2006.01)

(52) U.S. Cl.
CPC ....... *H03K 17/168* (2013.01); *H03K 17/0414* (2013.01); *H03K 17/04126* (2013.01)

(58) Field of Classification Search
CPC ...... H03K 17/16; H03K 17/168; H03K 17/30; H03K 17/04; H03K 17/0406; H03K 17/042; H03K 17/0422; H03K 17/0414
(Continued)

(56) References Cited

U.S. PATENT DOCUMENTS

| 5,343,141 A | 8/1994 | Metro et al. |
| 8,810,293 B2 * | 8/2014 | Hesener ............... H03K 7/08 327/108 |

(Continued)

FOREIGN PATENT DOCUMENTS

| DE | 39 05 645 A1 | 8/1990 |
| DE | 102 06 392 A1 | 9/2003 |

(Continued)

OTHER PUBLICATIONS

Mitchell, Mike: "Using PWM Timer_B as a DAC", Ti Application Report, pp. 1-21, XP055443341, Gefunden im Internet: URL:http://www.ti.com/lit/an/slaa116/slaa116.pdf fig. 3,5; 2000.

(Continued)

*Primary Examiner* — Tomi Skibinski
(74) *Attorney, Agent, or Firm* — Henry M. Feiereisen LLC

(57) ABSTRACT

A control device for driving a bipolar switchable power semiconductor component is designed to apply an electrical voltage to a gate terminal of the power semiconductor component and to reduce the electrical voltage for turning off the power semiconductor component from a first voltage value to a second voltage value. The control device is designed, for turning off the power semiconductor component, firstly to reduce the electrical voltage from the first (Continued)

voltage value to a desaturation value and then to reduce the electrical voltage from the desaturation value to the second voltage value. The desaturation value is greater than a pinch-off voltage of the power semiconductor component.

8 Claims, 5 Drawing Sheets

(58) Field of Classification Search
USPC .............. 327/427, 434, 437, 478, 108–112, 327/374–377, 379; 326/82, 83, 87; 323/282, 285, 289
See application file for complete search history.

(56) References Cited

U.S. PATENT DOCUMENTS

| | | | | |
|---|---|---|---|---|
| 9,748,947 | B1* | 8/2017 | Wagoner | .............. H03K 17/567 |
| 2011/0304942 | A1* | 12/2011 | Rozman | .................. H02H 1/04 |
| | | | | 361/101 |
| 2013/0221941 | A1* | 8/2013 | Rozman | .................. H02H 3/08 |
| | | | | 323/282 |
| 2018/0198442 | A1* | 7/2018 | Hokazono | .............. H03K 17/30 |

FOREIGN PATENT DOCUMENTS

| | | |
|---|---|---|
| DE | 10 2015 220 594 A1 | 4/2016 |
| EP | 2 632 048 A1 | 8/2013 |
| SU | 464038 A1 | 3/1975 |

OTHER PUBLICATIONS

PCT International Search Report and Written Opinion of International Searching Authority dated Dec. 12, 2018 corresponding to PCT International Application No. PCT/EP2017/078420 filed Jul. 11, 2017.

* cited by examiner

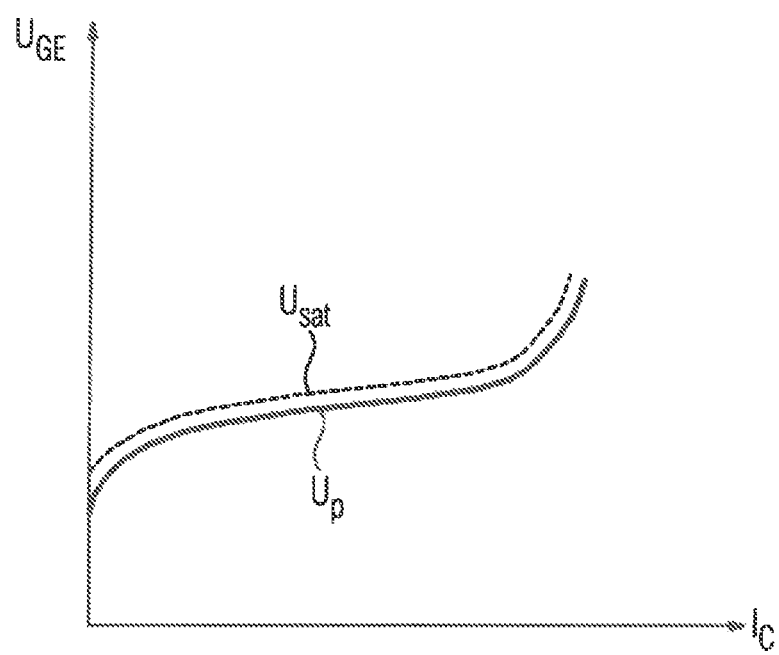
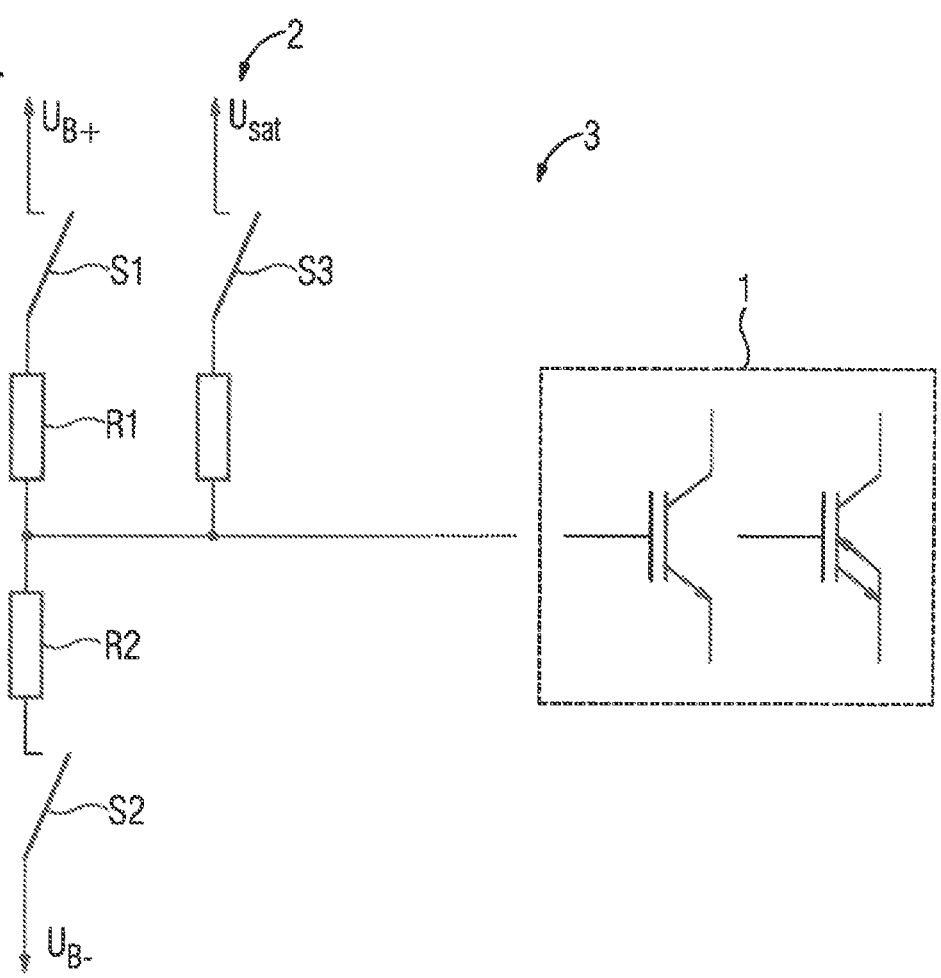

CONTROL DEVICE FOR DRIVING A BIPOLAR SWITCHABLE POWER SEMICONDUCTOR COMPONENT, SEMICONDUCTOR MODULE AND METHOD

CROSS-REFERENCES TO RELATED APPLICATIONS

This application is the U.S. National Stage of International Application No. PCT/EP2017/078420, filed Nov. 7, 2017, which designated the United States and has been published as International Publication No. WO 2018/133962 A1 and which claims the priority of European Patent Application, Serial No. 17151987.9, filed Jan. 18, 2017, pursuant to 35 U.S.C. 119(a)-(d).

BACKGROUND OF THE INVENTION

The present invention relates to a control device for driving a bipolar switchable power semiconductor component, wherein the control device is designed to apply an electrical voltage to a gate terminal of the power semiconductor component and, in order to turn off the power semiconductor component, to reduce the electrical voltage from a first voltage value to a second voltage value. In addition, the present invention relates to a semiconductor module having such a control device. Finally, the present invention relates to a method for controlling a bipolar switchable power semiconductor component.

In this case the interest is focused on bipolar switchable or deactivatable power semiconductor components. Such a bipolar switchable power semiconductor component can be, in particular, an IGBT. When turning off bipolar switchable power semiconductor components, the charge carriers required for the flow of current must be dispelled. When conventional and reverse-conducting IGBTs are turned off by dispelling the charge carriers, this results in high electrical field strengths. As a result of this field strength loading, the power semiconductor component cannot be shut down at any arbitrary speed. Furthermore, the rate of increase of the electrical voltage on the load terminals is limited primarily by the requirements of the load. Both the charge carrier concentration in the power semiconductor component and the switching speed affect the turn-off losses of the power semiconductor component. To minimize the losses the switching speed—limited by the safe operating range that must be maintained—is set as high as possible. This is normally effected by means of a suitable choice of the magnitude of a gate discharge current.

The gate of the turned-on power semiconductor component is charged to an electrical voltage with a first voltage value. When turning off the power semiconductor component, the gate is discharged via a resistor to an electrical voltage with a second voltage value. The electrical voltage is therefore reduced from the first voltage value to the second voltage value. The transition from the conducting state with a high charge carrier concentration to the de-energized state results in comparatively high turn-off losses.

DE 39 05 645 A1 discloses a control method for improving the overcurrent turn-off behavior of power semiconductor switches with MOS control input. Furthermore, DE 102 06 392 A1 discloses a method and a device for optimizing the turn-off process of a non-latching, deactivatable power semiconductor switch. Finally, DE 10 2015 220 594 A1 discloses a semiconductor drive unit and a power converter which uses the former.

The object of the present invention is to specify a solution as to how a bipolar switchable power semiconductor component of the aforementioned type can be more efficiently turned off.

SUMMARY OF THE INVENTION

This object is achieved according to the invention by means of a control device, by a semiconductor module and by a method having the features in accordance with the respective independent claims. Advantageous extensions of the present invention are the subject matter of the dependent claims.

A control device according to the invention is used to drive a bipolar switchable power semiconductor component. The control device in this case is designed to apply an electrical voltage to a gate terminal of the power semiconductor component and, in order to turn off the power semiconductor component, to reduce the electrical voltage from a first voltage value to a second voltage value. The control device is also designed, for turning off the power semiconductor component, firstly to reduce the electrical voltage from the first voltage value to a desaturation value and then to reduce the electrical voltage from the desaturation value to the second voltage value, wherein the desaturation value is greater than a pinch-off voltage of the power semiconductor component.

The control device can be used to control a bipolar power semiconductor component that can be turned on or off. For example, the control device may be part of a control circuit. The power semiconductor component can be, in particular, a bipolar transistor with an insulated gate terminal (Insulated Gate Bipolar Transistor IGBT). The control device is electrically connected to the gate electrode or gate terminal of the power semiconductor component. It can also be provided that the control device has a gate resistor which is connected to the gate terminal of the power semiconductor component. The control device can be used to provide electrical voltages with different voltage values and/or apply them to the gate terminal. For example, the electrical voltage with the first voltage value can be applied to the gate terminal in order to turn on the power semiconductor component. If the electrical voltage with the first voltage value is applied to the gate terminal, it is provided, in particular, that a gate-emitter voltage of the power semiconductor component is above a threshold. In this case, the power semiconductor component is in the conducting state. When the power semiconductor component is to be turned off, the electrical voltage is reduced from the first voltage value to the second voltage value by means of the control device.

In accordance with an essential aspect of the present invention, it is provided that, by means of the control device, the electrical voltage at the gate terminal is firstly reduced from the first voltage value to the desaturation value and is then reduced to the second voltage value. To turn off the power semiconductor component therefore, the electrical voltage at the gate terminal, or the gate-emitter voltage, is not reduced to the second voltage value directly, but rather the electrical voltage is initially set to the desaturation value. This desaturation value is less than the first voltage value and greater than the second voltage value. In other words, a desaturation pulse is provided at the gate terminal shortly before the actual turn-off process. This desaturation pulse discharges the gate, or the gate terminal, of the power semiconductor component to a voltage which is slightly above the cut-off voltage of the power semiconductor component. This cut-off voltage can also be referred to as the pinch-off voltage. If the pinch-off-voltage is present at the power semiconductor component, one channel of the power semiconductor component is constricted. Because the electrical voltage at the gate terminal is firstly reduced to the desaturation value, the charge carrier concentration within the power semiconductor component can be reduced. Therefor, during the turn-off process of the power semiconductor component, less charge needs to be dispelled from the power semiconductor component. This allows the turn-off losses when turning off the power semiconductor component to be reduced, and therefore the turn-off process can be carried out more efficiently.

The control device has a first switch for applying the electrical voltage with the first voltage value to the gate terminal, and a second switch for applying the electrical voltage with the second voltage value to the gate terminal. The first switch and the second switch can be activated independently of each other. The first switch is used to connect the gate terminal to the electrical voltage with the first voltage value. In the same way, the second switch is used to connect the gate terminal to the electrical voltage with the second voltage value. Using the respective switches it is possible, for example, to switch an electrical connection between the gate terminal and a voltage source which provides the electrical voltage with the first voltage value or the second voltage value. It can also be provided that the gate terminal is connected to a voltage sink by means of the switches.

The control device is designed to activate the first switch and/or the second switch periodically and to set the electrical voltage to the desaturation value by specifying a duty cycle for the activation of the first switch and/or of the second switch. In other words, the electrical voltage at the gate terminal can be provided in a pulse-width modulated form. The lowering of the gate-emitter voltage can therefore be achieved by a pulse-width modulation. By using a suitable mark-to-space ratio, the voltage at the gate terminal of the power semiconductor component can be set to the desaturation value. This allows a reliable adjustment of the electrical voltage at the gate terminal.

The control device is preferably designed to apply the electrical voltage with the desaturation value to the gate terminal for a specific pulse duration. In particular, is provided that the electrical voltage is maintained or applied to the gate terminal with the desaturation value until the number of charge carriers in the power semiconductor component is reduced. While the electrical voltage with the desaturation value is applied to the power semiconductor component, the excess charge is immediately dispelled by the load current. At the same time, the charge carriers recombine, although this happens at a much slower rate. During this time the forward voltage also increases. In this case, the pulse duration during which the electrical voltage with the desaturation value is applied to the power semiconductor component is pre-defined. The pulse duration can be defined, for example, on the basis of previous measurements. This allows an efficient turn-off process to be achieved.

In accordance with a further configuration, the control device comprises a measuring unit for measuring a gate-emitter voltage between the gate terminal and an emitter terminal of the power semiconductor component during the turn-off process, and the control device is designed to determine the pulse duration on the basis of the gate-emitter voltage. It can therefore be provided that the gate-emitter voltage is measured continuously during the turn-off process. The gate-emitter voltage describes the electrical voltage that is applied at the gate terminal of the power semiconductor component by means of the control device. Thus, the output of the voltage by means of the control device, or the gate-emitter voltage, can be determined continuously and, consequently, the pulse duration can be set precisely.

In a further embodiment, the control device comprises a measuring unit for measuring a collector current at a collector terminal of the power semiconductor component and the control device is designed to determine the desaturation value on the basis of the collector current. As already described, the desaturation value can be determined on the basis of the pinch-off voltage of the power semiconductor component. The pinch-off voltage can be determined from the relationship between the collector current and the gate-emitter voltage. It is in particular provided that the collector current is measured prior to turning off the power semiconductor component, and the desaturation value, or the electrical voltage with the desaturation value, is determined such that it is very close in value to the pinch-off voltage or only minimally exceeds the pinch-off voltage. The desaturation value can thereby be reliably determined.

In one embodiment, in order to turn off the power semiconductor component the control device is designed to open the first switch, then to close the second switch for a first time interval, and then to open the second switch for a second time interval, and subsequently to close the second switch. For example, the first switch can be closed at a first time and the second switch can be opened at the same time. After the first time interval the second switch can be re-opened. The second switch therefore remains open for the second time interval. The first time interval and the second time interval are chosen such that overall the desaturation value is obtained for the voltage at the gate terminal. The sum of the first time interval and the second time interval corresponds, in particular, to the pulse duration. The second time interval represents that of a high-impedance activation, or a switch-over to a high-impedance gate resistance. After the desaturation pulse the second switch can then be re-opened at a second time, in order to discharge the gate completely. Therefore, the electrical voltage at the gate terminal can be controlled using the first and second switch.

According to a further embodiment, the control device has a third switch for applying the electrical voltage with the desaturation value, and the control device is designed to open the first switch and to close the third switch at a first time, and to open the third switch and close the second switch at a second time. When the power semiconductor component is in the conducting state, the first switch is closed. To turn off the power semiconductor component, at the first time point the first switch is opened and the third switch is simultaneously closed. Therefore, the electrical voltage with the desaturation value is applied at the gate terminal. After decreasing the number of charge carriers in the power semiconductor component, at a second time point the third switch is opened and the second switch is closed. Therefore, the electrical voltage with the second voltage value is applied at the gate terminal. Therefore, the power semiconductor component can be turned off with reduced switching losses.

In a further embodiment the control device has an analog amplifier for providing the electrical voltage with the first voltage value, with the desaturation value and with the second voltage value. The analog amplifier can be designed as an analog power amplifier stage, by means of which the electrical voltage at the gate terminal can be continuously adjusted. With such a type of power amplifier it is theoretically possible to adjust optimized gate voltage trajectories over a wide range. Therefore, a regulation of the current and/or voltage transients of the power semiconductor component to be controlled is possible.

A semiconductor module according to the invention comprises a bipolar switchable power semiconductor component and a control device according to the invention. The control device according to the invention is used to drive the bipolar switchable power semiconductor component. The power semiconductor component may be, in particular, a bipolar transistor with an insulated gate electrode, or insulated gate terminal. The power semiconductor component can therefore be designed as an IGBT. The semiconductor component can be a converter, for example. In particular, it is provided that the pulse duration during which the electrical voltage with the desaturation value is applied to the power semiconductor component is taken into account in the controller of the converter, since this acts an additional turn-off delay.

A method according to the invention is used to drive a bipolar switchable power semiconductor component. By means of a control device an electrical voltage is applied to a gate terminal of the power semiconductor component and in order to turn off the power semiconductor component, the electrical voltage is reduced from a first voltage value to a second voltage value. It is provided in this case that the electrical voltage to turn off the power semiconductor component is firstly reduced from the first voltage value to a desaturation value and the electrical voltage value is then reduced from the desaturation value to the second voltage value, the desaturation value being greater than a pinch-off voltage of the power semiconductor component.

The advantages and refinements described in relation to the control device according to the invention apply, mutatis mutandis, to the semiconductor module according to the invention and to the method according to the invention.

BRIEF DESCRIPTION OF THE DRAWING

The present invention will now be described in greater detail based on preferred exemplary embodiments and by reference to the attached drawings. The figures show:

FIG. 3 a waveform of a pinch-off voltage and a desaturation value of the electrical voltage;

FIG. 4 a semiconductor module comprising a control device and a power semiconductor component, according to a first embodiment;

DETAILED DESCRIPTION OF PREFERRED EMBODIMENTS

In the figures, identical and functionally equivalent elements are indicated by identical reference marks.

Figure 1:
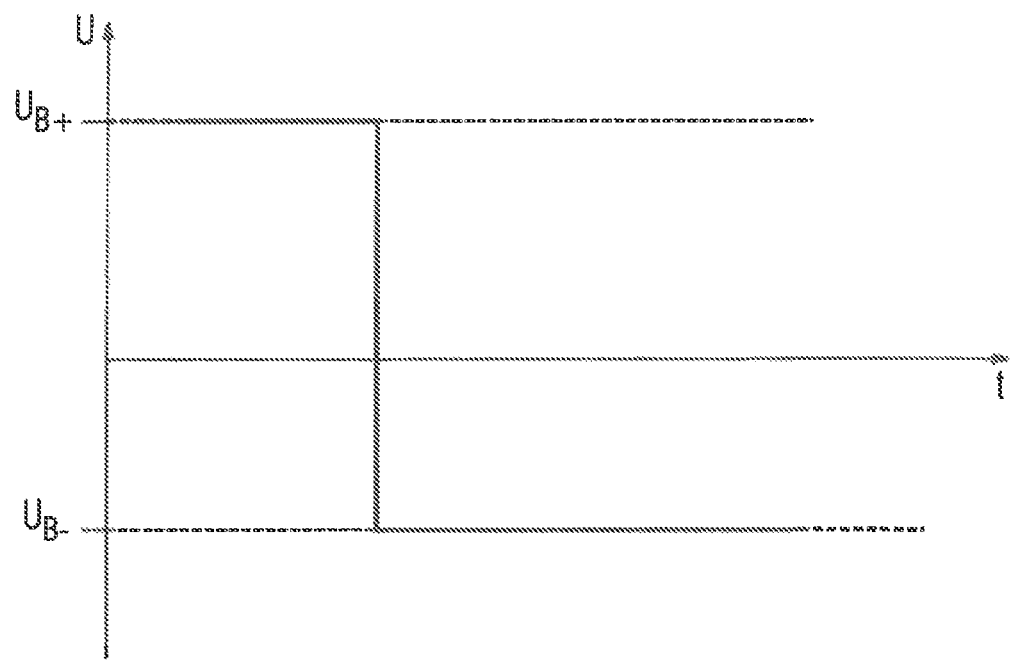
FIG. 1 a temporal waveform of an electrical voltage at a gate terminal before a gate discharge resistor of a power semiconductor component when turning off the power semiconductor component in accordance with the prior art.

FIG. 1 shows a waveform of an electrical voltage U as a function of time t, which is present at a gate terminal of the power semiconductor component 1 while a power semiconductor component 1 is being turned off. The electrical voltage U describes the voltage before a possible gate discharge resistor, which is usually arranged between the gate terminal of the power semiconductor component 1 and the control device 2. In this case the waveform of the voltage U which is shown in FIG. 1 describes a turn-off process in accordance with the prior art. If the power semiconductor component 1 is turned on, an electrical voltage U with a first voltage value $U_{B-}$ is present at the gate terminal. The first voltage value $U_{B+}$ can be a positive electrical voltage. When the power semiconductor component 1 is turned off, the electrical voltage U is reduced from the first voltage value $U_{B+}$ to a second voltage $U_{B-}$. The second voltage value $U_{B-}$ can be assigned, for example, to a negative electrical voltage. The direct transition from the conducting state with a high charge carrier concentration to the de-energized state results in comparatively high turn-off losses.

Figure 2:
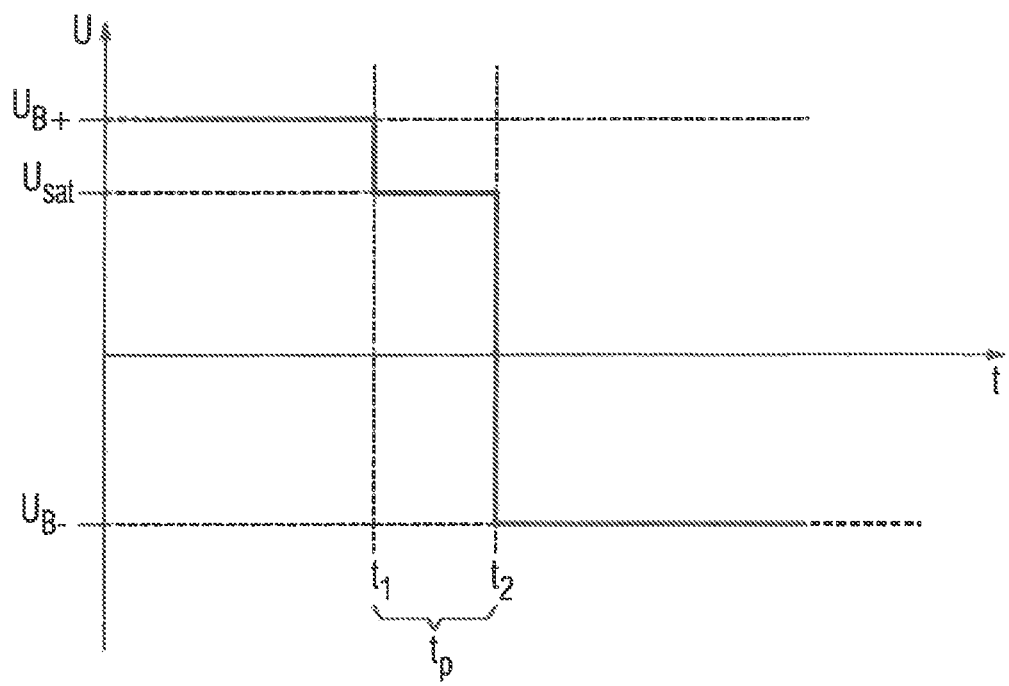
FIG. 2 the temporal waveform of the electrical voltage at the gate terminal of the power semiconductor component when turning off the power semiconductor component in accordance with one embodiment of the invention.

In comparison to this, FIG. 2 shows the waveform of the electrical voltage U as a function of time t for a turn-off process in accordance with one embodiment of the invention. In this case, the electrical voltage U at the gate terminal is firstly reduced from the first voltage $U_{B+}$ to a desaturation value $U_{Sat}$ and subsequently to the second voltage $U_{B-}$. The electrical voltage U with the desaturation value $U_{B-}$ is present at the gate terminal for a predefined pulse duration $t_P$. The pulse duration $t_p$ begins at a first time t1 and ends at a second time t2. Because the electrical voltage U at the gate terminal is firstly reduced to the desaturation value $U_{Sat}$, the charge carrier concentration can be reduced before the actual turn-off process of the power semiconductor component 1. As a result, less charge needs to be dispelled from the power semiconductor component 1 during the turn-off process. The turn-off losses are therefore reduced.

This desaturation value $U_{Sat}$ is determined such that it has a value slightly above a load current-dependent cut-off voltage $U_P$ of the power semiconductor component 1. This cut-off voltage $U_P$ can also be referred to as the pinch-off voltage. FIG. 3 shows a waveform of the pinch-off voltage value $U_P$ together with the waveform of the desaturation voltage value $U_{Sat}$. The diagram in FIG. 3 in this case shows the gate-emitter voltage $U_{GE}$ as a function of the collector current $I_C$. The desaturation value $U_{Sat}$ can have a specified level which corresponds at least to the maximum anticipated pinch-off voltage $U_P$. The desaturation value $U_{Sat}$ can also be set very close to the pinch-off voltage $U_P$ due to the collector current $I_C$ being measured before turning off. However, this requires an adjustable voltage source or voltage sink.

FIG. 4 shows a semiconductor module 3 according to a first embodiment. The semiconductor module 3 comprises a control device 2 and the power semiconductor component 1. The power semiconductor component 1 can be implemented as a conventional or reverse-conducting IGBT. In the present case an example equivalent circuit diagram of the reverse-conducting IGBT Is shown for the power semiconductor component 1. In this exemplary embodiment the control device 2 comprises a first switch S1, by means of which the power semiconductor component 1 can be connected to an electrical voltage U with the first voltage value UB+ via a first resistor R1. Furthermore, the control device 2 comprises a second switch S2, by means of which the power semiconductor component 1 can be connected to an electrical voltage U with the second voltage value UB− via a second resistor R2. The control device 2 also comprises a third switch S3, by means of which the power semiconductor component 1 can be connected to an electrical voltage U with the desaturation value USat via a third resistor R3. The control device 2 further Includes a first measuring unit 2a for measuring a gate-emitter voltage $U_{GE}$ between the gate terminal G and an emitter terminal E of the power semiconductor component, and a second measuring unit 2b for measuring a collector current $I_C$ at a collector terminal C of the power semiconductor component.

Figure 5:
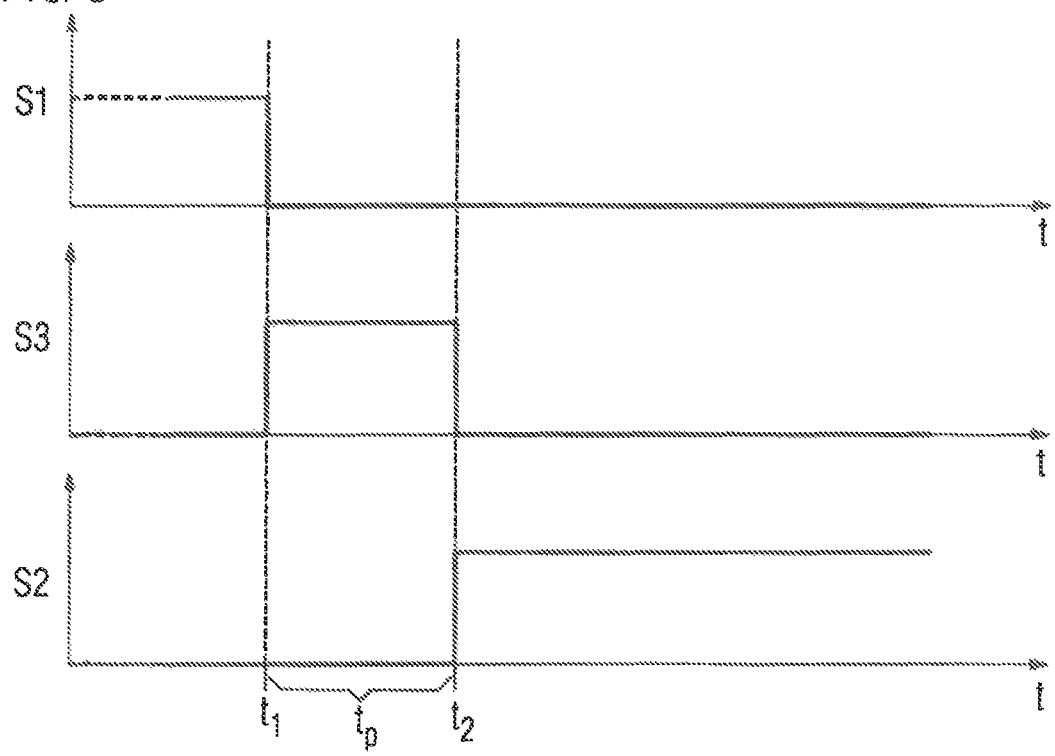
FIG. 5 switching characteristics of switches of the control device in accordance with FIG. 4 as a function of time.

FIG. 5 shows the switching characteristics of the switches S1, S2 and S3 of the control device 2 according to FIG. 4 as a function of time t. To turn off the power semiconductor component 1, the first switch S1 is opened at the first time point t1. At the same time, the third switch S3 is closed. This causes the saturation pulse to be initiated for the pulse duration $t_P$. After reducing the number of charge carriers in the power semiconductor component 1, by activating only the second switch S2 at the second time t2 the power semiconductor component 1 is turned off with a reduced charge carrier concentration and, therefore, reduced switching losses.

Figure 6:
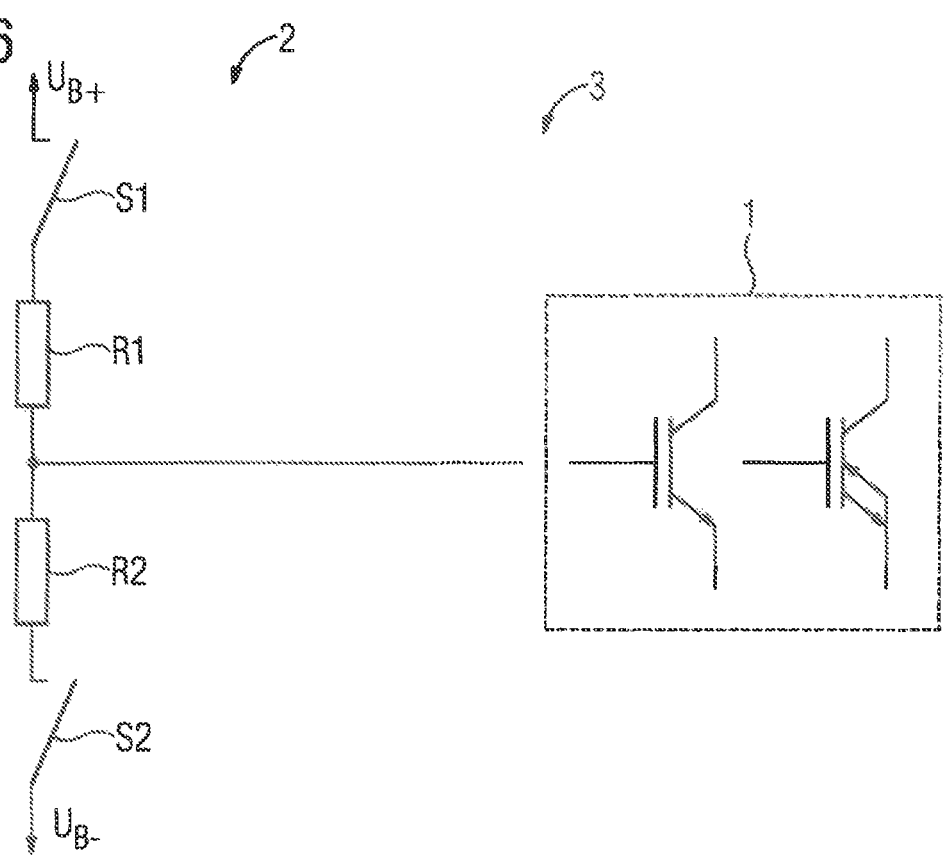
FIG. 6 a semiconductor module with a control device in accordance with another embodiment.

FIG. 6 shows a semiconductor module 3 according to a further embodiment. In this case the control device 2 comprises only the first switch S1 and the second switch S2, which were described in connection with the switching device 2 according to FIG. 4. In this case, the additional voltage level of the desaturation value $U_{Sat}$ is not required. As explained below, the reduction of the gate-emitter voltage $U_{GE}$ can be carried out by a brief and incomplete discharging of the gate.

Figure 7:
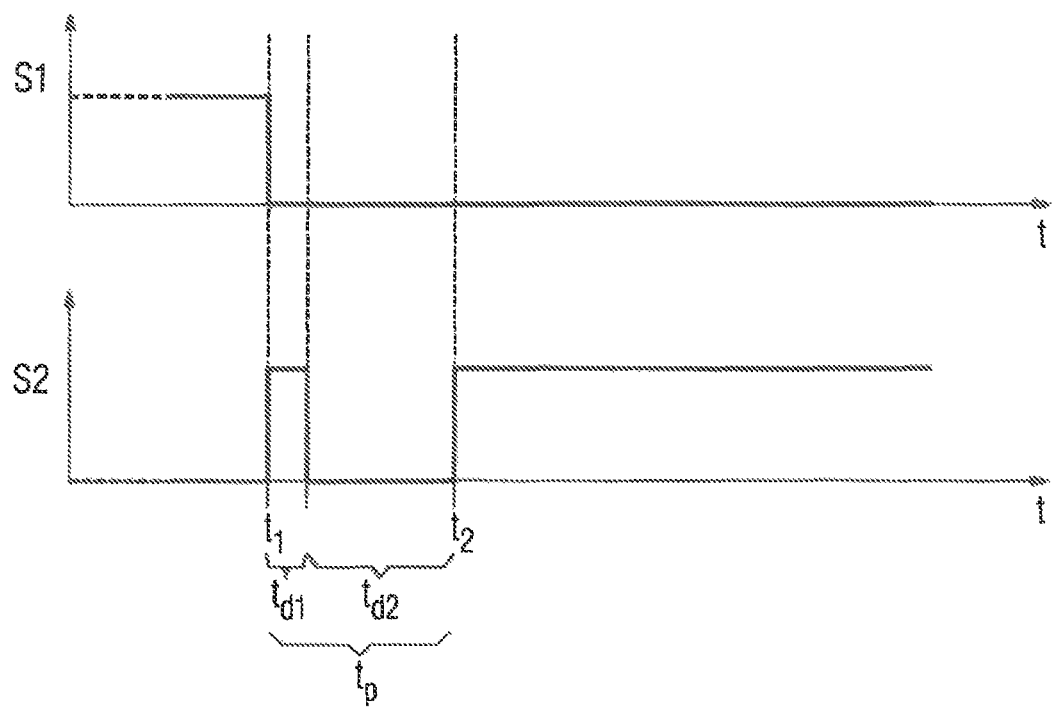
FIG. 7 switching characteristics of the switches of the control device in accordance with FIG. 6 in a first embodiment.

FIG. 7 shows the switching characteristics of the switches S1 and S2 of the control device 2 according to FIG. 6 as a function of time t according to a first embodiment. In this case, the voltage U at the gate is brought to the desaturation value $U_{Sat}$ by deactivating the first switch S1 and briefly activating the second switch S2. At the first time t1 the first switch S1 is opened and the second switch S2 is closed for the first time interval $t_{d1}$. The first time interval $t_{d1}$ can either be specified as a fixed value or can be determined by measurement of the gate-emitter voltage. For this purpose, it would also be possible to detect an associated increase in the collector-emitter voltage. After the desaturation value $U_{Sat}$ is reached, both the first switch S1 and the second switch S2 are deactivated for the second time interval $t_{d2}$ and the control is therefore set to high impedance. Alternatively, by switching over to a high-impedance gate resistance a smaller gate current can also be set. After the desaturation value $U_{Sat}$, which is present for the pulse duration $t_P$, the switching operation is continued at the second time t2 with activation of the second switch S2.

Figure 8:
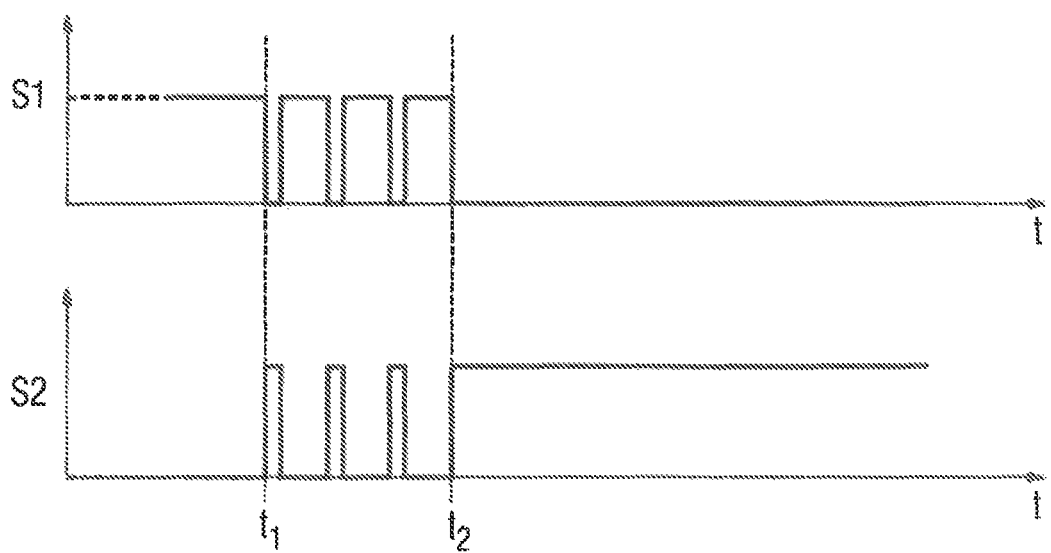
FIG. 8 switching characteristics of the switches of the control device in accordance with FIG. 6 in a second embodiment.

FIG. 8 shows the switching characteristics of the switches S1 and S2 of the control device 2 according to FIG. 6 as a function of time t according to a second embodiment. In this case, the gate-emitter voltage $U_{GE}$ is achieved by a pulse-width modulation. By using a suitable mark-to-space ratio, the desaturation value $U_{Sat}$ is set at the gate terminal of the power semiconductor component 1. Before the gate of the power semiconductor component 1 is discharged to the second voltage $U_{B-}$ using the second switch S2, by means of a pulse-width modulation the desaturation pulse is initiated by activation of the first switch S1 and the second switch S2. In this case, the desaturation value $U_{Sat}$ is adjusted with the corresponding duty cycle of the first switch S1 and the second switch S2.

Figure 9:
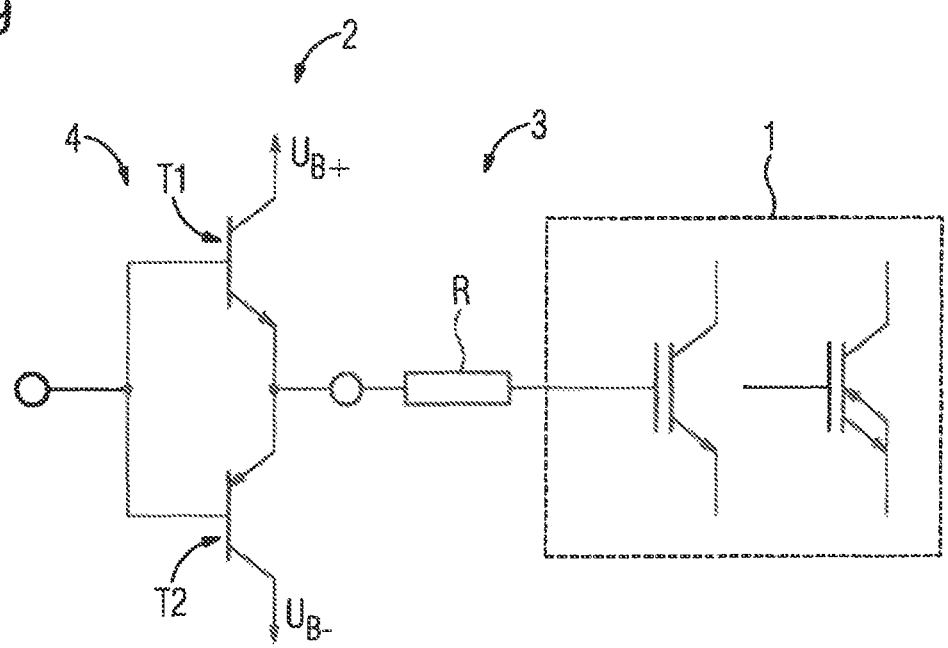
FIG. 9 a semiconductor module with a control device in accordance with another embodiment.

FIG. 9 shows a semiconductor module 3 according to a further embodiment. In this case the control unit 2 comprises an analog amplifier 4, or analog power amplifier stage. The amplifier 4 comprises a first transistor T1, via which the electrical voltage U with the first voltage value $U_{B+}$ can be applied to the power semiconductor component via the resistor R. The amplifier 4 also comprises a second transistor T2, via which the electrical voltage U with the second voltage $U_{B-}$ can be applied to the power semiconductor component 1. By using the amplifier 4 the electrical voltage U can be adjusted continuously. Thus, the waveform of the electrical voltage U, which has been explained in connection with FIG. 2, can be applied at the gate terminal of the power semiconductor component 1.

By the use of the control device 2 or by way of the turn-off characteristics, the field-strength load on the power semiconductor component 1 when turning the device off is reduced, since the charge carrier concentration in the power semiconductor component 1 is reduced due to the saturation value $U_{Sat}$. When utilizing the robustness limits or the safe operating range, which in particular describe higher switching speeds by a higher gate discharge current without exceeding the field strength limits, switching losses can be significantly reduced. In particular, this can be exploited if the rate of increase of the voltage at the main terminals of the power semiconductor component 1 is not limited by the application. The semiconductor modules 3 described can, in particular, form part of a converter. Therefore, due to the reduction of the switching losses the efficiency of the converter can be increased.

What is claimed is:

1. A control device for driving a bipolar switchable power semiconductor component, said control device being configured to apply an electrical voltage to a gate terminal of the power semiconductor component and, in order to turn off the power semiconductor component, to reduce the applied electrical voltage from a first voltage value to a desaturation value and then to reduce the applied electrical voltage from the desaturation value to a second voltage value, with the desaturation value being greater than a pinch-off voltage of the power semiconductor component, said control device comprising:
   a first switch configured to apply the electrical voltage with the first voltage value to the gate terminal;
   a second switch configured to apply the electrical voltage with the second voltage value to the gate terminal; and
   a first measuring unit configured to measure a collector current at a collector terminal of the power semiconductor component, with the desaturation value being determined on the basis of the collector current,
   wherein at least one of the first and second switches is activated periodically, and wherein the applied electrical voltage is set to the desaturation value by specifying a duty cycle for the activation of the at least one of the first and second switches.

2. The control device of claim 1, wherein the control device is configured to apply the electrical voltage with the desaturation value to the gate terminal for a specific pulse duration.

3. The control device of claim 2, further comprising a second measuring unit configured to measure a gate-emitter voltage between the gate terminal and an emitter terminal of the power semiconductor component as the power semiconductor component is turned off, with the pulse duration being determined on the basis of the gate-emitter voltage.

4. A semiconductor module, comprising:
a bipolar switchable power semiconductor component; and
a control device for driving the bipolar switchable power semiconductor component, said control device being configured to apply an electrical voltage to a gate terminal of the power semiconductor component and, in order to turn off the power semiconductor component, to reduce the applied electrical voltage from a first voltage value to a desaturation value and then to reduce the applied electrical voltage from the desaturation value to a second voltage value, with the desaturation value being greater than a pinch-off voltage of the power semiconductor component, said control device comprising a first switch configured to apply the electrical voltage with the first voltage value to the gate terminal, a second switch configured to apply the electrical voltage with the second voltage value to the gate terminal, and a first measuring unit configured to measure a collector current at a collector terminal of the power semiconductor component, with the desaturation value being determined on the basis of the collector current, wherein at least one of the first and second switches is activated periodically, and wherein the applied electrical voltage is set to the desaturation value by specifying a duty cycle for the activation of the at least one of the first and second switches.

5. The semiconductor module of claim 4, wherein the control device is configured to apply the electrical voltage with the desaturation value to the gate terminal for a specific pulse duration.

6. The semiconductor module of claim 5, further comprising a second measuring unit configured to measure a gate-emitter voltage between the gate terminal and an emitter terminal of the power semiconductor component as the power semiconductor component is turned off, with the pulse duration being determined on the basis of the gate-emitter voltage.

7. The semiconductor module of claim 4, wherein the bipolar switchable power semiconductor component is a bipolar transistor with insulated gate terminal.

8. A method for driving a bipolar switchable power semiconductor component, said method comprising:
applying by a control device an electrical voltage to a gate terminal of the power semiconductor component;
in order to turn off the power semiconductor component, reducing the applied electrical voltage from a first voltage value to a desaturation value and then reducing the applied electrical voltage from the desaturation value to a second voltage value, with the desaturation value being greater than a pinch-off voltage of the power semiconductor component;
applying via a first switch the electrical voltage with the first voltage value to the gate terminal;
applying via a second switch the electrical voltage with the second voltage value to the gate terminal;
periodically activating at least one of the first and second switches;
setting the applied electrical voltage to the desaturation value by specifying a duty cycle for the activation of the at least one of the first and second switches;
measuring a collector current at a collector terminal of the power semiconductor component; and
determining the desaturation value on the basis of the collector current.

* * * * *